United States Patent [19]
Igarashi et al.

[11] Patent Number: 6,081,442
[45] Date of Patent: Jun. 27, 2000

[54] CONTENTS ADDRESSABLE MEMORY CIRCUIT FOR RETRIEVAL OPERATION IN UNITS OF DATA BLOCKS

[75] Inventors: Kenji Igarashi; Toshiyuki Kanoh, both of Tokyo, Japan

[73] Assignee: NEC Corporation, Tokyo, Japan

[21] Appl. No.: 09/265,889

[22] Filed: Mar. 11, 1999

[30] Foreign Application Priority Data

Mar. 20, 1998 [JP] Japan .................................. 10-090643

[51] Int. Cl.[7] .................................................. G11C 15/00
[52] U.S. Cl. ...................................... 365/49; 365/189.07
[58] Field of Search ................................ 365/49, 189.07, 365/189.08

[56] References Cited

U.S. PATENT DOCUMENTS

| | | | |
|---|---|---|---|
| 4,958,377 | 9/1990 | Takahashi | 382/34 |
| 5,173,872 | 12/1992 | Crawford et al. | 365/49 |
| 5,388,066 | 2/1995 | Hamamoto et al. | 365/49 |
| 5,450,351 | 9/1995 | Heddes | 365/49 |

FOREIGN PATENT DOCUMENTS

| | | |
|---|---|---|
| 0 814 416 | 12/1997 | European Pat. Off. . |
| 5-189979 | 7/1993 | Japan . |

*Primary Examiner*—Son Mai
*Attorney, Agent, or Firm*—Sughrue, Mion, Zinn, Macpeak & Seas, PLLC

[57] ABSTRACT

A contents addressable memory circuit includes an inputting section, a contents addressable memory section and a control section. The inputting section divides an input data into n (n is an integer equal to or larger than 2) data blocks and supplies the n data blocks and an input address. The contents addressable memory section performs a data retrieving operation in units of data blocks to output addresses and coincidence flags corresponding to the data blocks. The coincidence flag is indicative of whether there is a data coincident with the corresponding data block. The control section outputs one of the outputted addresses based on the outputted addresses and the coincidence flags.

16 Claims, 5 Drawing Sheets

CONTENTS ADDRESSABLE MEMORY CIRCUIT FOR RETRIEVAL OPERATION IN UNITS OF DATA BLOCKS

BACKGROUND OF THE INVENTION

1. Field of the Invention

The present invention relates to a contents addressable memory (CAM) circuit, and more particularly, to a contents addressable memory circuit, in which a data having an arbitrary bit width can be retrieved at a high speed using a plurality of existing contents addressable memories.

2. Description of the Related Art

The contents addressable memory (CAM) is a memory which inputs a data having a certain bit width and outputs an address in which the data having the same content as the input data is stored. For example, in a data communication apparatus, when a reception data is stored in the contents addressable memory as a storage data, the reception data is stored in an address corresponding to the reception time. Accordingly, when a data having a particular content is inputted later, it is possible to retrieve the reception time of the reception data which is coincident with the particular content.

In such a contents addressable memory, if the storage data having the same bit pattern as the input data exists in a plurality of addresses, a plurality of addresses lines are turned on as coincident address lines. Thus, the contents addressable memory requires an address encoder for specifying one of the coincident address lines in accordance with a certain priority, when a retrieval start address and a data are specified. The address encoder encodes the address line corresponding to the smallest one of addresses subsequent to the retrieval start address or the largest address before the retrieval start address. However, the contents addressable memory having a large memory capacity requires a complicated logic circuit and also requires a processing time. Therefore, various address encoders are proposed. For example, a priority encoder is described in Japanese Laid Open Patent Application (JP-A-Heisei 5-189979) in which a plurality of addresses where a storage data coincident with an input data are stored are outputted one by one.

However, in such a conventional contents addressable memory, the bit width of a data stored in an address is determined on the design of the contents addressable memory. For example, when the bit width of the storage data or of the retrieved data is desired to be expanded, it is necessary to newly design a contents addressable memory having the necessary bit width as a word length. In this case, especially, when the bit width of the manipulated data is long, there is a problem of a cost.

SUMMARY OF THE INVENTION

It is, therefore, an object of the present invention to provide a contents addressable memory circuit, which uses a plurality of contents addressable memories each having proper word lengths.

Another object of the present invention is to provide a contents addressable memory circuit, in which a desirable address can be retrieved at a high speed.

In order to achieve an aspect of the present invention, a contents addressable memory circuit, includes an inputting section, a contents addressable memory section and a control section. The inputting section divides an input data into n (n is an integer equal to or larger than 2) data blocks and supplies the n data blocks and an input address. The contents addressable memory section performs a data retrieving operation in units of data blocks to output addresses and coincidence flags corresponding to the data blocks. The coincidence flag is indicative of whether there is a data coincident with the corresponding data block. The control section outputs one of the outputted addresses based on the outputted addresses and the coincidence flags.

Here, the control section may include a flag detecting section, an address coincidence detecting section and an address output section. The flag detecting section outputs a total coincidence flag based on the coincidence flags. The address coincidence detecting section outputs an address coincidence flag based on the outputted addresses and the total coincidence flag. The address output section outputs one of the outputted addresses in response to the address coincidence flag. Also, the flag detecting section may include a NAND gate for inputting the coincidence flags and outputting the total coincidence flag. Also, the flag detecting section may include a logic section for detecting whether corresponding bits of the outputted addresses are equal to each other, over all the corresponding bits of the outputted addresses, and an OR gate for inputting the total coincidence flag and the detecting result of the logic section and for outputting an address valid signal. Further, the address output section may include an OR gate for inputting one of the outputted addresses and the address valid signal and outputting the one outputted address.

The contents addressable memory section preferably includes n (n is an integer equal to or larger than 2) contents addressable memories. Each of the n contents addressable memories performs the data retrieving operation to the corresponding data block to output the outputted address and the coincidence flag for the corresponding data block. In this case, an i-th (i is an integer lager than 1 and equal to or smaller than n) contents addressable memory of the n contents addressable memories receives the corresponding data block from the inputting section and the outputted address outputted from an (i−1)-th contents addressable memory to perform the data retrieving operation. Also, the i-th contents addressable memory outputs the outputted address to an (i+1)-th contents addressable memory and the coincidence flag. Also, the control section outputs an address coincidence flag when all the outputted addresses are coincident with each other. At that time, a first contents addressable memory receives the corresponding data block from the inputting section and selectively receives the input address from the inputting section and the retrieved address from an n-th contents addressable memory based on the address coincidence flag, and performs the data retrieving operation to output the retrieved address and the coincidence flag for the corresponding data block.

In order to achieve another aspect of the present invention, a method of retrieving an address for an input data in a contents addressable memory circuit, includes:

- dividing an input data into n (n is an integer equal to or larger than 2) data blocks;
- performing a data retrieving operation in units of data blocks using an input address as a retrieval start address to generate an output address for every data block;
- when any one of retrieved data for the data blocks is not coincident with a corresponding data block or when the output addresses for all the data blocks are not coincident with each other, repeating the performing step using a new retrieval start address;
- when data coincident with the data blocks are retrieved and the output addresses for all the data blocks are coincident with each other, generating an address valid signal; and outputting one of the output addresses in response to the address valid signal.

The new retrieval start address may be one of the output addresses.

Also, the step of performing a data retrieving operation includes performing the data retrieving operation to the data blocks by n (n is an integer equal to or larger than 2) contents addressable memories, to output the output addresses for the corresponding data blocks, respectively. In this case, the step of performing a data retrieving operation includes:

receiving the corresponding data block from the inputting section and the retrieved address outputted from an (i−1)-th contents addressable memory by an i-th (i is an integer lager than 1 and equal to or smaller than n) contents addressable memory of the n contents addressable memories, to perform the data retrieving operation; and outputting the retrieved address from the (i−1)-th contents addressable memory to an (i+1)-th contents addressable memory.

Further, the step of performing a data retrieving operation includes:

receiving the corresponding data block and the input address for a first cycle of the data retrieving operation by a first contents addressable memory; and performing the data retrieving operation for a first cycle to output the output address for the corresponding data block, and wherein the repeating step includes:

determining whether all the output addresses are coincident with each other;

receiving the corresponding data block and the output address from a n-th contents addressable memory for cycles subsequent to the first cycle of the data retrieving operation by the first contents addressable memory in response to the address valid signal; and performing the data retrieving operation for the subsequent cycle to output the output address for the corresponding data block.

DESCRIPTION OF THE PREFERRED EMBODIMENTS

Next, the contents addressable memory circuit of the present invention will be described below in detail with reference to the attached drawings.

Figure 1:
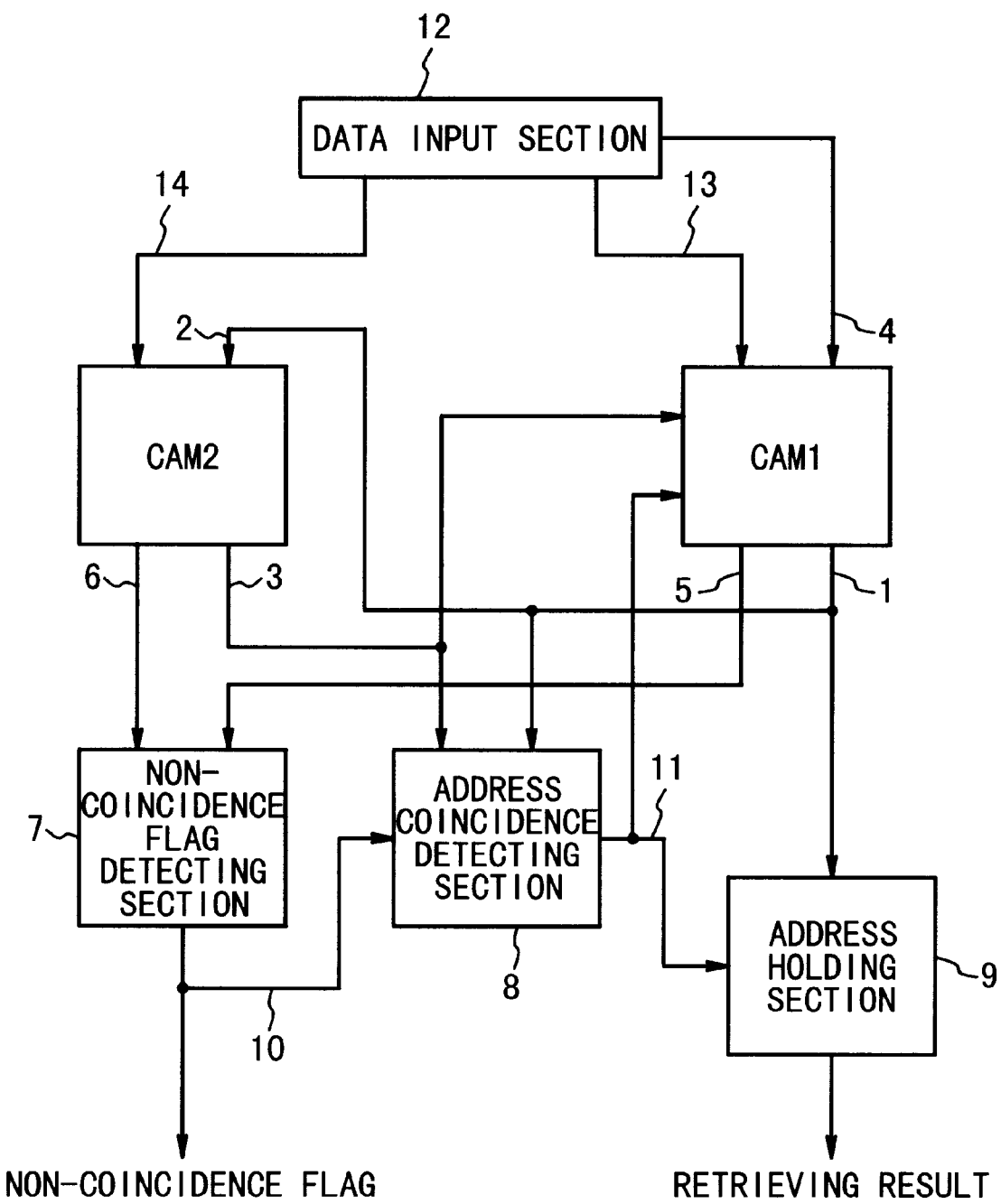
FIG. 1 is a block diagram illustrating the structure of a contents addressable memory circuit according to a first embodiment of the present invention.

FIG. 1 is a block diagram illustrating the structure of a contents addressable memory circuit according to the first embodiment of the present invention. Referring to FIG. 1, the contents addressable memory circuit in the first embodiment is composed of a data input section 12, a contents addressable memory section and a control section. The contents addressable memory section is composed of the first and second contents addressable memories CAM1 and CAM2. The control section is composed of a non-coincidence flag detector 7, an address coincidence detector 8, and an address holding section 9.

The data input section 12 inputs a data and an address. The data input section 12 divides the inputted data into an upper bit portion 13 and a lower bit portion 14 to supply to the first and second contents addressable memories CAM1 and CAM2. Also, the data input section 12 specifies the address as a retrieval start address 4 for the first contents addressable memory CAM1 to supply the first contents addressable memory CAM1.

The first contents addressable memory CAM1 retrieves an address 1 where a data coincident with the upper bit portion 13 is stored, using the retrieval start address 4, to supply to the address coincidence detecting section 8, the address holding section 9 and the second contents addressable memory CAM2. Also, the first contents addressable memory CAM1 outputs a coincidence flag 5 to the non-coincidence flag detecting section 10. The coincidence flag 5 is set to "1" to indicate that a data coincident with the upper it portion 13 exists in the first contents addressable memory CAM1, i.e., the coincidence between the data and the upper bit portion 13. Otherwise, the coincidence flag 5 is set to "0".

The second contents addressable memory CAM2 retrieves an address 3 where a data coincident with the lower bit portion 14 is stored, using the address outputted from the first contents addressable memory CAM1 as the retrieval start address 4. The retrieved address is supplied to the address coincidence detecting section 8, the address holding section 9 and the first contents addressable memory CAM2. Also, the second contents addressable memory CAM2 outputs a coincidence flag 6 to the non-coincidence flag detecting section 10. The coincidence flag 6 is set to "1" to indicate that a data coincident with the lower bit portion 14 exists in the second contents addressable memory CAM2, i.e., the coincidence between the data and the lower bit portion 14. Otherwise, the coincidence flag 6 is set to "0".

The non-coincidence flag detecting section 7 outputs a retrieval non-coincidence flag 10 based on the coincidence flags 5 and 6. The retrieval non-coincidence flag 10 is set to "1" when either one of the coincidence flags 5 and 6 indicates the non-coincidence. On the other hand, The retrieval non-coincidence flag 10 is set to "0" when both of the coincidence flags 5 and 6 indicate the coincidence.

Figure 2:
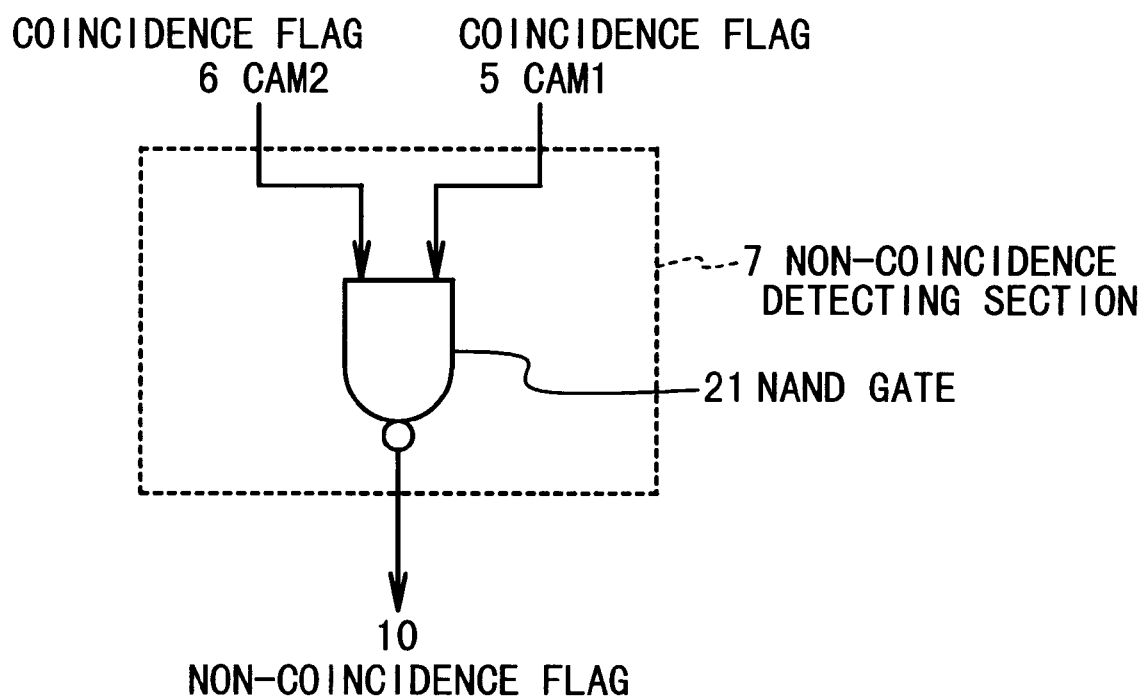
FIG. 2 is a circuit diagram illustrating the structure of a non-coincidence flag detector 7 shown in FIG. 1.

FIG. 2 is a circuit diagram showing the non-coincidence flag detecting section 7. The non-coincidence flag detecting section 7 is composed of a NAND gate 21. The NAND gate 21 outputs as the non-coincidence flag 10 the NAND logic result of the coincidence flag 5 from the contents addressable memory CAM1 and the coincidence flag 6 from the contents addressable memory CAM2. As described above, the non-coincidence flag 10 is set to the logic "1" when any one of the coincidence flags 5 and 6 indicates the non-coincidence, and set to the lock "0", otherwise.

The address coincidence detecting section 8 compares the address 1 outputted from the first contents addressable memory CAM1 with the address 3 outputted from the second contents addressable memory CAM2 in units of bits. The address coincidence detecting section 8 outputs an address valid signal 11 in response to the retrieval non-coincidence flag 10. The address valid signal 11 is set to "0"

when the address 1 outputted from the first contents addressable memory CAM1 with the address 3 outputted from the second contents addressable memory CAM2 are fully coincident with each other. Otherwise, The address valid signal 11 is set to "1".

Figure 3:
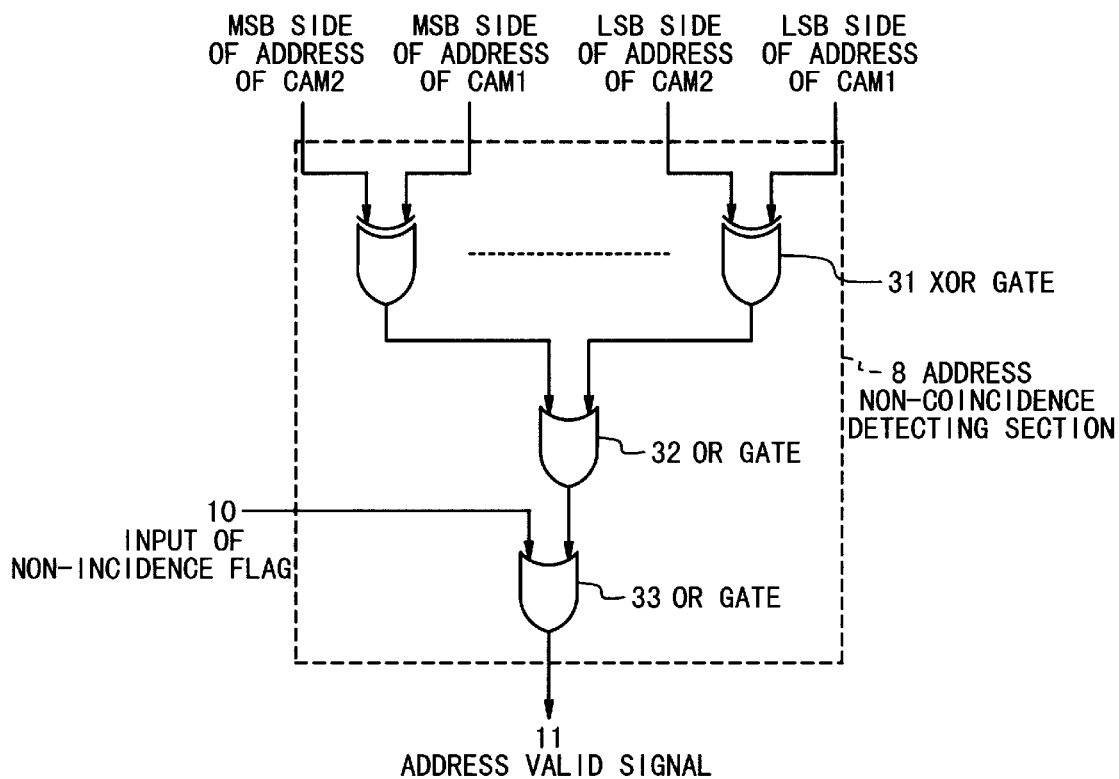
FIG. 3 is a circuit diagram illustrating the structure of an address coincidence detector 8 shown in FIG. 1.

FIG. 3 is a circuit diagram showing the address coincidence detecting section 8. The address coincidence detecting section 8 is composed of XOR (exclusive-OR) gates 31 a multi-input OR gate 32 and an OR gate 33. The exclusive-OR gates 31 executes an exclusive-OR calculation of the addresses 1 and 3 supplied from the contents addressable memories CAM1 and CAM2 in units of bits to output the exclusive-OR calculation result to the OR gate 32. The OR gate 33 executes an OR calculation of the outputs from the exclusive-OR gates 31 to output the OR calculation result to the OR gate 33. The OR gate 33 executes an OR calculation of the output from the OR gates 32 and the non-coincidence flag 10 outputted from the non-coincidence flag detecting section 7 to output the OR calculation result as the address valid signal 11. Thus, the address coincidence detecting section 8 outputs the address valid signal 11 of the logic "0" when the address 1 and the address 3 are coincident with each other and the retrieval non-coincidence flag 10 indicates the coincidence. Otherwise, the address valid signal 11 is set to the logic "1".

The address holding section 9 outputs the address 1 outputted from the contents addressable memory CAM1 in response to an address valid signal 11 outputted from the address coincidence detecting section 8.

Figure 4:
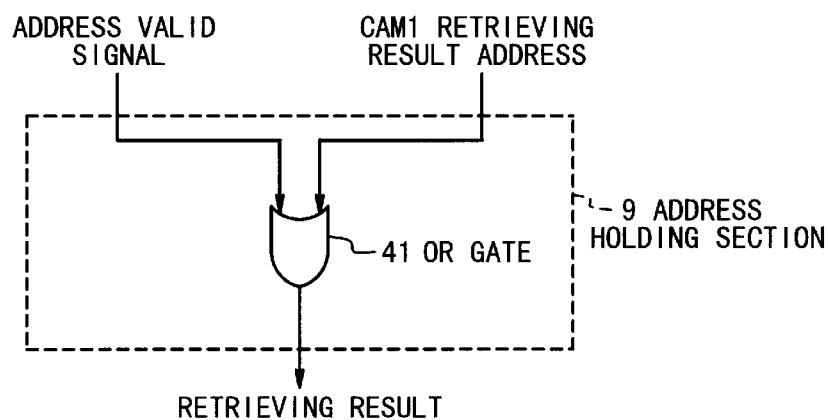
FIG. 4 is a circuit diagram illustrating the structure of an address holding section 9 shown in FIG. 1.

FIG. 4 is a circuit diagram showing the address holding section 9. The address holding section 9 is composed of OR gates 41, each of which executes an OR calculation of a corresponding bit of the address 1 and the address valid signal 11. Thus, the OR calculation results are outputted as a retrieval address.

The operations of the contents addressable memory circuit in the first embodiment will be described below with reference to FIGS. 2 to 5.

When a 16-bit data is inputted, the data input section 12 divides the inputted data into the upper 8-bit portion 13 and the lower 8-bit portion 14 to respectively supply to the first and second contents addressable memories CAM1 and CAM2. Both of the upper and lower 8-bit portions 13 and 14 are stored in the same address of the contents addressable memories CAM1 and CAM2.

Figure 5:
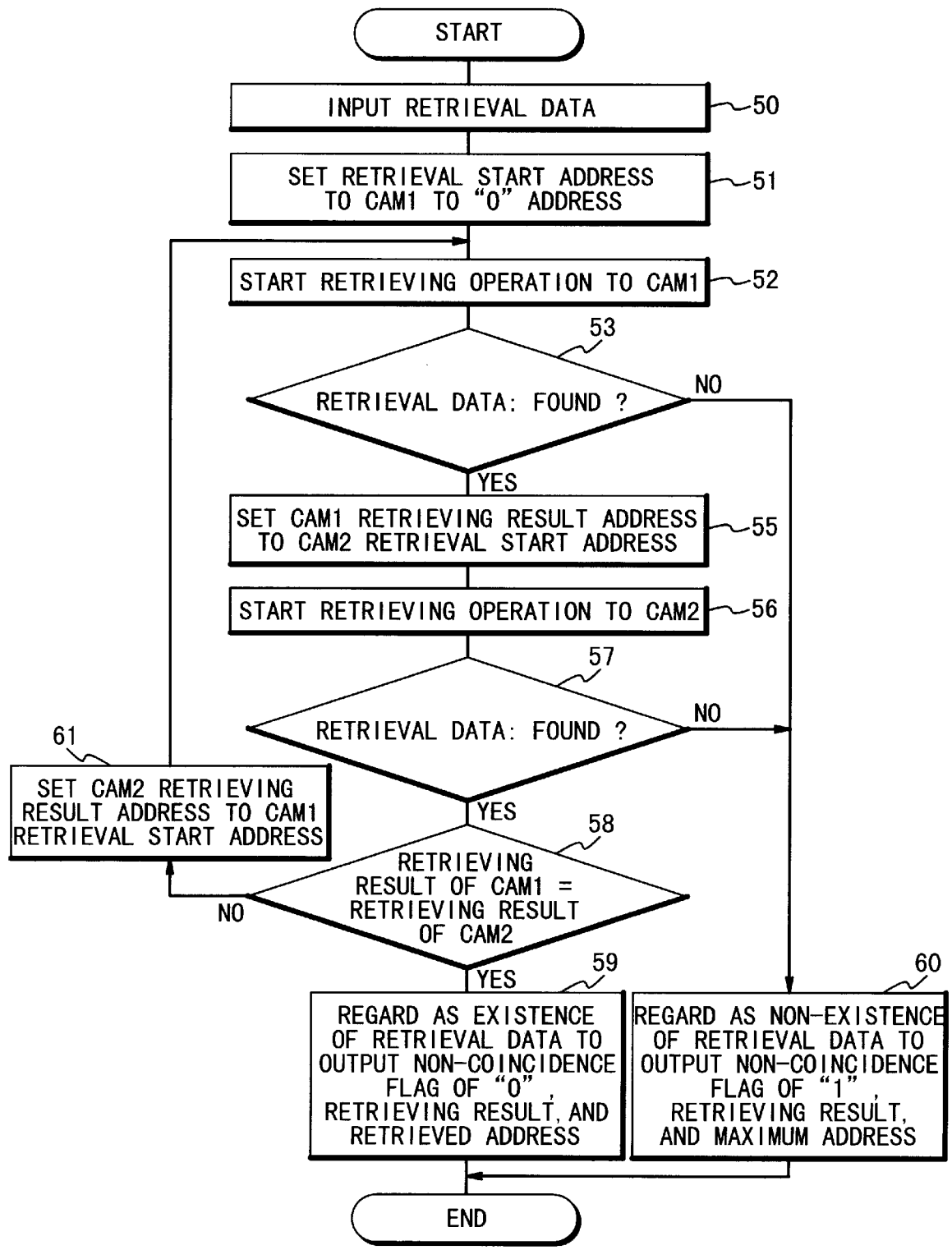
FIG. 5 is a flowchart showing an operation of the contents addressable memory circuit of the present invention.

Referring to FIG. 5, when a retrieval data and an retrieval start address are inputted (Step 50), the data input section 12 divides the retrieval data into the upper bit portion 13 and the lower bit portion 14, as in the case of the above storage of the data. Then, the data input section 12 supplies the upper and lower bit portions 13 and 14 to the contents addressable memories CAM1 and CAM2. Also, the data input section 12 sets the address of the contents addressable memory CAM1 to the inputted retrieval start address (Step 51). If the retrieval start address is specified, each of the contents addressable memories COM1 and COM2 starts the retrieving operation from the smallest one of addresses subsequent to the specified retrieval start address. In this case, If the retrieval start address is not specified, each of the contents addressable memories COM1 and COM2 starts the retrieving operation from the least significant address of "0". The contents addressable memories COM1 and COM2 may be used which start the retrieving operations from the largest one of addresses before the specified retrieval start address. In this case, If the retrieval start address is not specified, each of the contents addressable memories COM1 and COM2 starts the retrieving operation from the most significant address. Thus, the retrieving operation of the CAM1 is started (Step 52).

When a data coincident with the upper 8-bit portion of the input data is found by the contents addressable memory CAM1 (Step 53; YES), the coincidence flag 5 of "1" is outputted from the contents addressable memory CAM1 to the non-coincidence flag detecting section 7 to indicate the coincidence. Also, the address 1 where the data coincident with the upper 8-bit portion is stored, is outputted from the contents addressable memory CAM1 to the address coincidence detecting section 8, the address holding section 9, and the contents addressable memory CAM2. The contents addressable memory COM2 receives the address 1 as a retrieval start address 2 for the contents addressable memory CAM2 (Step 55). Thus, the retrieving operation of the contents addressable memory CAM2 is started (Step 56).

Similarly, when a data coincident with the lower 8-bit portion is detected by the contents addressable memory CAM2 (Step 57; YES), the address 3 is outputted from the contents addressable memory CAM2 to the address coincidence detecting section 8, and the contents addressable memory COM1.

Next, the address coincidence detecting section 8 compares the address 1 supplied from the contents addressable memory CAM1 with the address 3 supplied from the contents addressable memory CAM2 (Step 58). If the address 3 supplied from the contents addressable memory CAM2 is equal to the address 1 as the retrieval start address 2 (Step 58; YES), it is determined that the retrieval data is found. At the same time, the non-coincidence flag 10 is set to the logic "0" by the non-coincidence flag detecting section 7. As a result, the address valid signal 11 is set to the logic "0". Thus, the address 1 outputted from the contents addressable memory CAM1 is outputted as a retrieved address by the address holding section 9 (Step 59). Then, the retrieving operation is ended.

On the other hand, when the retrieving operation is performed until the last address but the data coincident with the upper or lower bit portion is not founded, the coincidence flag 5 supplied from the contents addressable memory CAM1 or the coincidence flag 5 supplied from the contents addressable memory CAM2 is set to the logic "0" (Step 53; NO, or Step 57; NO). In this case, the coincident data does not exist after the specified retrieval start address 1 (or before the specified retrieval start address 1) in any one of the contents addressable memories. Accordingly, the non-coincidence flag detecting section 7 outputs the non-coincidence flag 10 of the logic "1". Thus, the address valid signal 11 is set to the logic "1", so that the address holding section 9 outputs the address in which all the bits are set to the logic "1", namely, the most significant address (Step 60). Then, the retrieving operation is ended.

If the address 1 supplied from the contents addressable memory CAM1 is not coincident with the address 3 supplied from the contents addressable memory CAM2 at the step 58, the address 3 is supplied from the contents addressable memory CAM2 to the contents addressable memory CAM1. The contents addressable memory CAM1 receives the address 3 from the contents addressable memory CAM2 as the retrieval start address 4 in response to the address valid signal of the logic "1" (Step 61).

Thereafter, the control returns back to the step 52, and the retrieving operation of the contents addressable memory CAM1 is started again. Thus, the processes at the steps 52 to 61 are repeated until the address 1 supplied from the contents addressable memory CAM1 is coincident with the address 3 supplied from the contents addressable memory CAM2 at the step 58, or until any one of the coincidence flags 5 and 6 is set to the logic "0" at the step 53 or 58.

As mentioned above, in this embodiment, the two contents addressable memories are used and the input data is divided for the two contents addressable memories. Therefore, in the present invention, it is possible to store and retrieve the data having the bit width equal to two times the word length which can be treated by the individual contents addressable memory.

In the present invention, the address 1 is supplied to the contents addressable memory COM2 as the retrieval start address. Therefore, the retrieving operation is started from the address 1. That is, the retrieval range in the contents addressable memory COM2 can be narrowed or limited. Thus, an average retrieval time can be made shorter as compared with the case of retrieving the whole multi-bit data.

It should be noted that when an address is outputted as a retrieving result, the address 1 is equal to the address 3. Therefore, the address 3 may be supplied to the address holding section 9.

The present invention has been described while exemplifying the embodiment of controlling the first and second two contents addressable memories. However, the present invention is not limited to it. A contents addressable memory circuit may be achieved by controlling a plurality of contents addressable memories each having a proper word length as necessary.

Figure 6:
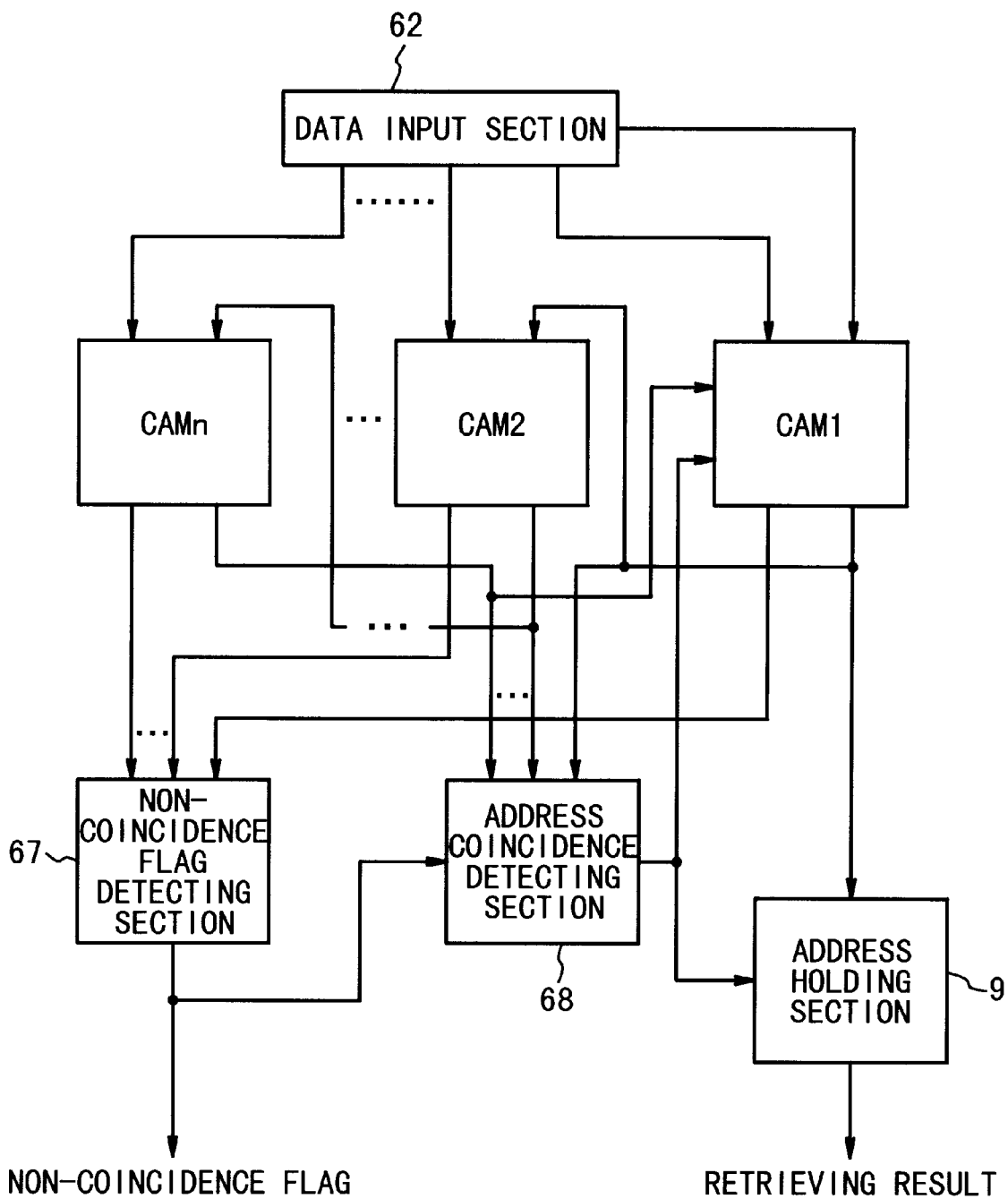
FIG. 6 is a block diagram illustrating the structure of the contents addressable memory circuit according to a second embodiment of the present invention.

FIG. 6 is a block diagram illustrating the structure of the contents addressable memory circuit according to the second embodiment of the present invention. The contents addressable memory controlling circuit in FIG. 6 is composed of a data input section 62, a contents addressable memory section and a control section. The contents addressable memory section is composed of n contents addressable memories CAM1 to CAMn. The control section is composed of a non-coincidence flag detecting section 67, an address coincidence detecting section 68 and an address holding section 9.

The data input section 62 inputs a data and an address and divides the input data into data blocks with bit widths corresponding to respective word lengths of the first to n-th contents addressable memories CAM1 to CAMn. The data input section 62 specifies the address as a retrieval start address for the first contents addressable memory CAM1.

The non-coincidence flag detecting section 67 outputs a retrieval non-coincidence flag of the logic "1" if any one of the coincidence flags of the first to n-th contents addressable memories CAM1 to CAMn becomes is set to the logic "0" to indicate that the coincident data does not exist in the addresses subsequent to the specified retrieval start address or before the specified retrieval start address, as in the non-coincidence flag detecting section 7. The address coincidence detecting section 68 outputs the address valid signal of the logic "0" if the non-coincidence flag is not set to the logic "1" and all the addresses outputted from the first to nth contents addressable memories CAM1 to CAMn are coincident with each other, as in the address coincidence detecting section 8. The address holding section 9 outputs as a retrieved result the address outputted from the first contents addressable memory CAM1 if the address valid signal is set to the logic "0".

The retrieving operation of the contents addressable memory circuit in the second embodiment is different from that of the contents addressable memory circuit in the first embodiment in the following points. That is, the i-th (i is an integer equal to or larger than 2 and equal to or smaller than (n−1)) contents addressable memory COMi receives a corresponding data block from the data input section 62 and an address outputted from the (i−1)-th contents addressable memory COMi 1 as a retrieval start address. Then, the i-th contents addressable memory COMi performs a retrieving operation to output a coincidence flag such as the flag 5 or 6 and an address. The coincidence flag is supplied to the non-coincidence flag detecting section 67. Also, the address is supplied from the i-th contents addressable memory COM1 to the (i+1)-th contents addressable memory COMi+1 and the address coincidence detecting section 68.

The first contents addressable memory COM1 receives an input address and a corresponding data block and performs a retrieving operation to output a coincidence flag such as the flag 5 or 6 and an address. The coincidence flag is supplied to the non-coincidence flag detecting section 67. Also, the address is supplied from the first contents addressable memory COM1 to the second contents addressable memory COM2 and the address coincidence detecting section 68.

the n-th contents addressable memory COMn receives a corresponding data block from the data input section 62 and an address from the (n−1)-th contents addressable memory COMn−1. Also, the n-th contents addressable memory COMn performs a retrieving operation to output a coincidence flag such as the flag 5 or 6 and an address. The coincidence flag is supplied to the non-coincidence flag detecting section 67. Also, the address is supplied from the n-th contents addressable memory COMn to the first contents addressable memory COM1 and the address coincidence detecting section 68.

According to the contents addressable memory circuit in the second embodiment shown in FIG. 6, it is possible to use the necessary number of contents addressable memories each having the proper word lengths. Thus, the contents addressable memory circuit is provided such that the data having any bit width can be stored and retrieved cheaply at a high speed, similar to the first embodiment shown in FIG. 1.

As described above, according to the contents addressable memory circuit of the present invention, the input data is divided in the bit direction for usage of a plurality of contents addressable memories each having the proper word lengths. Therefore, any multi-bit data can be stored and retrieved cheaply at a fast speed.

What is claimed is:

1. A contents addressable memory circuit, comprising:
    an inputting section for dividing an input data into n (n is an integer equal to or larger than 2) data blocks and for supplying said n data blocks and an input address;
    a contents addressable memory section for performing a data retrieving operation in units of data blocks to output addresses and coincidence flags corresponding to the data blocks, the coincidence flag being indicative of whether there is a data coincident with the corresponding data block; and
    a control section for outputting one of said outputted addresses based on the outputted addresses and the coincidence flags.

2. A contents addressable memory circuit according to claim 1, wherein said control section includes:
    a flag detecting section for outputting a total coincidence flag based on the coincidence flags;

an address coincidence detecting section for outputting an address coincidence flag based on the outputted addresses and the total coincidence flag; and an address output section for outputting one of said outputted addresses in response to the address coincidence flag.

3. A contents addressable memory circuit according to claim 2, wherein said flag detecting section includes a NAND gate for inputting the coincidence flags and outputting the total coincidence flag.

4. A contents addressable memory circuit according to claim 2, wherein said flag address coincidence detecting section includes:

a logic section for detecting whether corresponding bits of the outputted addresses are equal to each other, over all the corresponding bits of the outputted addresses; and an OR gate for inputting the total coincidence flag and the detecting result of said logic section and for outputting an address valid signal.

5. A contents addressable memory circuit according to claim 2, wherein said address output section includes an OR gate for inputting one of the outputted addresses and the address valid signal and outputting said one outputted address.

6. A contents addressable memory circuit according to claim 1, wherein said contents addressable memory section includes n (n is an integer equal to or larger than 2) contents addressable memories, each of which performs the data retrieving operation to the corresponding data block to output the outputted address and the coincidence flag for the corresponding data block.

7. A contents addressable memory circuit according to claim 6, wherein an i-th (i is an integer larger than 1 and equal to or smaller than n) contents addressable memory of said n contents addressable memories receives the corresponding data block from said inputting section and the outputted address outputted from an (i−1)-th contents addressable memory to perform the data retrieving operation, and outputs the outputted address to an (i+1)-th contents addressable memory and the coincidence flag.

8. A contents addressable memory circuit according to claim 7, wherein said control section output address coincidence flag when all the outputted addresses are coincident with each other, and wherein a first contents addressable memory receives the corresponding data block from said inputting section and selectively receives the input address from said inputting section and the retrieved address from an n-th contents addressable memory based on the address coincidence flag, and performs the data retrieving operation to output the retrieved address and the coincidence flag for the corresponding data block.

9. In a contents addressable memory circuit, a method of retrieving an address for an input data, comprising:

dividing an input data into n (n is an integer equal to or larger than 2) data blocks;

performing a data retrieving operation in units of data blocks using an input address as a retrieval start address to generate an output address for every data block;

when any one of retrieved data for the data blocks is not coincident with a corresponding data block or when the output addresses for all the data blocks are not coincident with each other, repeating said performing step using a new retrieval start address;

when data coincident with the data blocks are retrieved and the output addresses for all the data blocks are coincident with each other, generating an address valid signal; and outputting one of said output addresses in response to the address valid signal.

10. A method according to claim 9, wherein said new retrieval start address is one of the output addresses.

11. A method according to claim 9, wherein said performing step includes generating a coincidence flag for each data block to indicate that the data coincident with the data block is retrieved, and wherein said repeating step includes:

generating a total coincidence flag when all the coincidence flags are coincident with each other; and generating an address valid signal in response to the total coincidence flag when all the output addresses are coincident with each other.

12. A method according to claim 11, wherein said step of generating a total coincidence flag includes executing a NAND logic calculation of the coincidence flags to output the total coincidence flag.

13. A method according to claim 11, wherein said step of generating an address valid signal includes:

detecting whether corresponding bits of the output addresses are equal to each other, over all the corresponding bits of the output addresses; and executing an OR logic calculation of the total coincidence flag and the detecting result to output an address valid signal.

14. A method according to claim 9, wherein said step of performing a data retrieving operation includes performing the data retrieving operation to the data blocks by n (n is an integer equal to or larger than 2) contents addressable memories, to output the output addresses for the corresponding data blocks, respectively.

15. A method according to claim 14, wherein said step of performing a data retrieving operation includes:

receiving the corresponding data block from said inputting section and the retrieved address outputted from an (i−1)-th contents addressable memory by an i-th (i is an integer lager than 1 and equal to or smaller than n) contents addressable memory of said n contents addressable memories, to perform the data retrieving operation; and outputting the retrieved address from the (i−1)-th contents addressable memory to an (i+1)-th contents addressable memory.

16. A method according to claim 15, wherein said step of performing a data retrieving operation includes:

receiving the corresponding data block and the input address for a first cycle of the data retrieving operation by a first contents addressable memory; and performing the data retrieving operation for a first cycle to output the output address for the corresponding data block, and wherein said repeating step includes:

determining whether all the output addresses are coincident with each other;

receiving the corresponding data block and the output address from a n-th contents addressable memory for cycles subsequent to the first cycle of the data retrieving operation by the first contents addressable memory in response to the address valid signal; and performing the data retrieving operation for the subsequent cycle to output the output address for the corresponding data block.

* * * * *

UNITED STATES PATENT AND TRADEMARK OFFICE
CERTIFICATE OF CORRECTION

PATENT NO.: 6,081,442
DATED: June 27, 2000
INVENTOR(S): Kenji IGARASHI, Toshiyuki KANOH It is certified that error(s) appears in the above-identified patent and that said Letters Patent is hereby corrected as shown below:

Column 4, line 25, delete "it" insert --bit--.

Column 7, line 59, delete "nth" insert --n-th--.

Column 8, line 7, delete "comi 1" insert --comi -1--.

Column 9, line 40, delete "output" insert outputs an--.

Signed and Sealed this

Twenty-fourth Day of April, 2001

NICHOLAS P. GODICI

*Attest:*

*Attesting Officer*          *Acting Director of the United States Patent and Trademark Office*